(12) United States Patent
Kum

(10) Patent No.: US 12,342,456 B2
(45) Date of Patent: Jun. 24, 2025

(54) DISPLAY DEVICE

(71) Applicant: Samsung Display Co., LTD., Yongin-si (KR)

(72) Inventor: Kyobum Kum, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/600,839

(22) Filed: Mar. 11, 2024

(65) Prior Publication Data

US 2024/0381525 A1    Nov. 14, 2024

(30) Foreign Application Priority Data

May 12, 2023   (KR) .................. 10-2023-0061927

(51) Int. Cl.
| | | |
|---|---|---|
| *H05K 1/02* | (2006.01) | |
| *G06F 3/041* | (2006.01) | |
| *G06F 3/044* | (2006.01) | |
| *G09G 3/32* | (2016.01) | |
| *H10K 59/131* | (2023.01) | |
| *H10K 59/90* | (2023.01) | |

(52) U.S. Cl.
CPC ........... *H05K 1/028* (2013.01); *G06F 3/0412* (2013.01); *G06F 3/0443* (2019.05); *G09G 3/32* (2013.01); *H10K 59/131* (2023.02); *G09G 2354/00* (2013.01); *H05K 2201/10128* (2013.01); *H10K 59/90* (2023.02)

(58) Field of Classification Search
CPC ..... H05K 1/028; G06F 3/0443; G06F 3/0412; H10K 59/131; G09G 3/32
See application file for complete search history.

(56) References Cited

U.S. PATENT DOCUMENTS

2022/0408548 A1\* 12/2022 Niu ................... H05K 1/189

FOREIGN PATENT DOCUMENTS

| KR | 10-1997-0058423 | 7/1997 |
|---|---|---|
| KR | 10-2016-0085388 | 7/2016 |
| KR | 10-2019-0080271 | 7/2019 |
| KR | 10-2021-0084062 | 7/2021 |
| KR | 10-2022-0062761 | 5/2022 |

\* cited by examiner

*Primary Examiner* — Sardis F Azongha
(74) *Attorney, Agent, or Firm* — KILE PARK REED & HOUTTEMAN PLLC

(57) ABSTRACT

A display device according to an embodiment includes a display panel including a pad area and a flexible printed circuit board connected to the display panel. The flexible printed circuit board includes a body where components are located, a pressing portion disposed along an edge of the body and attached to the pad area, and a bypass portion having an end to another end connected to the boy and including wires.

20 Claims, 16 Drawing Sheets

DISPLAY DEVICE

CROSS-REFERENCE TO RELATED APPLICATION

This application claims priority to and the benefit of Korean Patent Application No. 10-2023-0061927 under 35 U.S.C. § 119, filed at the Korean Intellectual Property Office (KIPO) on May 12, 2023, the entire contents of which are incorporated herein by reference.

BACKGROUND

1. Technical Field

This disclosure relates to a display device, and more particularly, to a display device including a display panel and a flexible printed circuit board connected thereto.

2. Description of the Related Art

The display device may include pixels and display an image on a display screen by controlling the brightness of each pixel. The display device may include a touch sensing unit capable of sensing a user's touch. The display device may include a display panel on which pixels are formed. The touch sensor may be provided on the display panel. For example, the display panel may include a touch sensing unit, or a panel including the touch sensing unit may be attached to the display panel.

The display device may include a flexible printed circuit board for transmitting signals for driving pixels and signals for driving a touch sensor to a display panel.

SUMMARY

A flexible printed circuit board included in the display device may have a multilayer structure including conductive layers. For example, the flexible printed circuit board may have a structure in which units having conductive layers formed on both sides or one side of a base film are laminated or stacked. In order to reduce the thickness and dead space of the display device, it may be desirable to reduce the thickness and size of the flexible printed circuit board. However, since many types of signals are transmitted through the flexible printed circuit board and a touch driver and the like are mounted on the flexible printed circuit board, it is difficult to reduce the number (thickness) and size of the flexible printed circuit board.

In addition, conductive layers transmitting different signals may overlap each other on the flexible printed circuit board, and thus interference may occur between signals. A conductive layer for shielding these conductive layers is required, making it difficult to reduce the number of layers of the flexible printed circuit board.

Embodiments provide a flexible printed circuit board capable of reducing the number of layers and preventing interference between signals, and a display device including the same.

A display device according to an embodiment includes a display panel including a pad area and the flexible printed circuit board connected to the display panel.

The flexible printed circuit board includes a body where components are located, a pressing portion disposed along an edge of the body and attached to the pad area, and a bypass portion having an end and another end both connected to the body and including wires.

The bypass portion may be bent so that at least a portion of the bypass portion overlaps the body.

The display device may further include a shielding layer disposed between the bypass portion and the body in a bent state of the bypass portion.

The display device may further include a display driver disposed on the display panel, and a cover covering at least a portion of the display driver and the flexible printed circuit board.

The bypass portion may be disposed between the body and the cover in a bent state of the bypass portion.

The display device may further include a double-sided adhesive tape attaches the flexible printed circuit board to a rear surface of the display panel.

The bypass portion may be disposed between the body and the double-sided adhesive tape in a bent state of the bypass portion.

The bypass portion may include a first leg portion and a second leg portion extending from the body, and a connection portion connected between the first leg portion and the second leg portion.

The connection portion and the pressing portion may extend in a same direction.

The first leg portion and the second leg portion may be bent, and the connection portion may be attached to the body.

The flexible printed circuit board may include conductive layers which are sequentially stacked.

A number of the conductive layers included in the bypass portion may be smaller than a number of the conductive layers included in the body.

The number of the conductive layers included in the bypass portion may be equal to a number of the conductive layers included in the pressing portion.

The body portion may include three or more conductive layers, and the bypass may include two or less conductive layers.

The bypass portion may include a support film, a first conductive layer disposed on a first surface of the support film, and a second conductive layer disposed on a second surface of the support film.

The first conductive layer may include a wire transmitting a touch signal, and the second conductive layer may include a ground layer.

The bypass portion may be bent so that at least a portion of the bypass portion overlaps the body.

The second conductive layer may be disposed farther from the body than the first conductive layer in a bent state of the bypass portion.

The portions may include a touch driver.

The wire disposed in the bypass portion may electrically connect the touch driver and the pad of the pressing portion.

A display device according to an embodiment includes a main area including a display area and a touch area, and a sub-area extending from the main area and in which the display driver is located, and a flexible printed circuit board connected to the sub-area.

The flexible printed circuit board includes a body in which the touch driver is located, a pressing portion disposed along an edge of the body and attached to the sub-area, a tail extending from the body and having the connector disposed at an end, and the body and a bypass portion including the first leg portion and the second leg portion extending in the same direction from the first leg portion, and the connection portion connected between the first leg portion and the second leg portion.

The first leg portion and the second leg portion may be bent, and the connection portion may overlap the body.

The display device may further include a shielding layer overlapping the connection portion and the body, and disposed between the connection portion and the body.

The flexible printed circuit board may include conductive layers which are sequentially stacked.

A number of the conductive layers included in the bypass portion may be less than a number of the conductive layers included in the body, and may be equal to a number of the conductive layers included in the pressing portion.

The body may include a first conductive layer, a second conductive layer, a third conductive layer, and a fourth conductive layer arranged in a thickness direction.

The bypass portion, the first conductive layer, and the second conductive layer may include a same conductive layer, or the bypass portion, the third conductive layer, and the fourth conductive layer may include a same conductive layer.

According to embodiments, the flexible printed circuit board capable of reducing the number of layers and preventing interference between signals and the display device including the flexible circuit board may be provided. Further, according to the embodiments, there are advantageous effects that can be recognized throughout the specification.

The technical objectives to be achieved by the disclosure are not limited to those described herein, and other technical objectives that are not mentioned herein would be clearly understood by a person skilled in the art from the description of the disclosure.

DETAILED DESCRIPTION OF THE EMBODIMENTS

Figure 1:
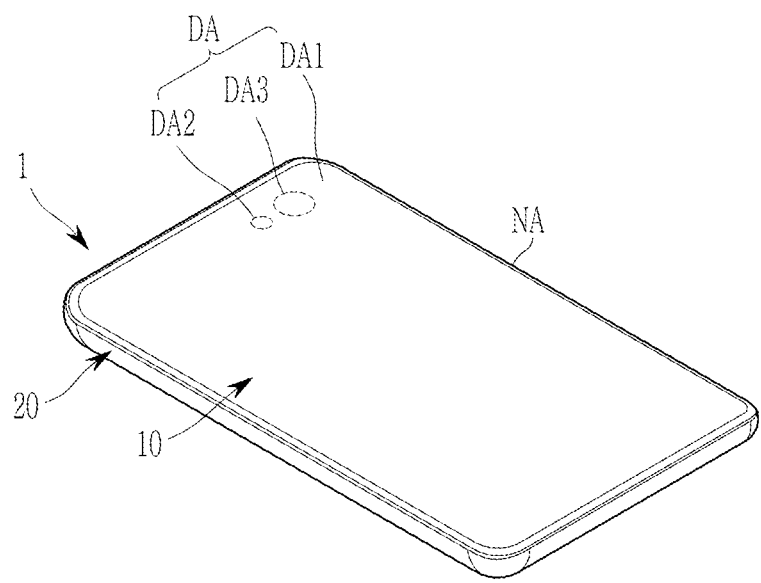
FIG. 1 is a schematic perspective view of an electronic device according to an embodiment.
Figure 1:
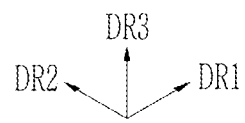

With reference to the accompanying drawings, embodiments will be described in detail so that those skilled in the art can carry out.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

It will be further understood that the terms "comprise," "include," "have," and the like, when used in this specification, specify the presence of stated features, integers, steps, operations, elements, components, and/or combinations of them but do not preclude the presence or addition of one or more other features, integers, steps, operations, elements, components, and/or combinations thereof.

In the drawings, the symbols "DR1," "DR2," and "DR3" are used to indicate directions, where "DR1" is a first direction, "DR2" is a second direction perpendicular to the first direction, and "DR3" is a third direction perpendicular to the first and second directions.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
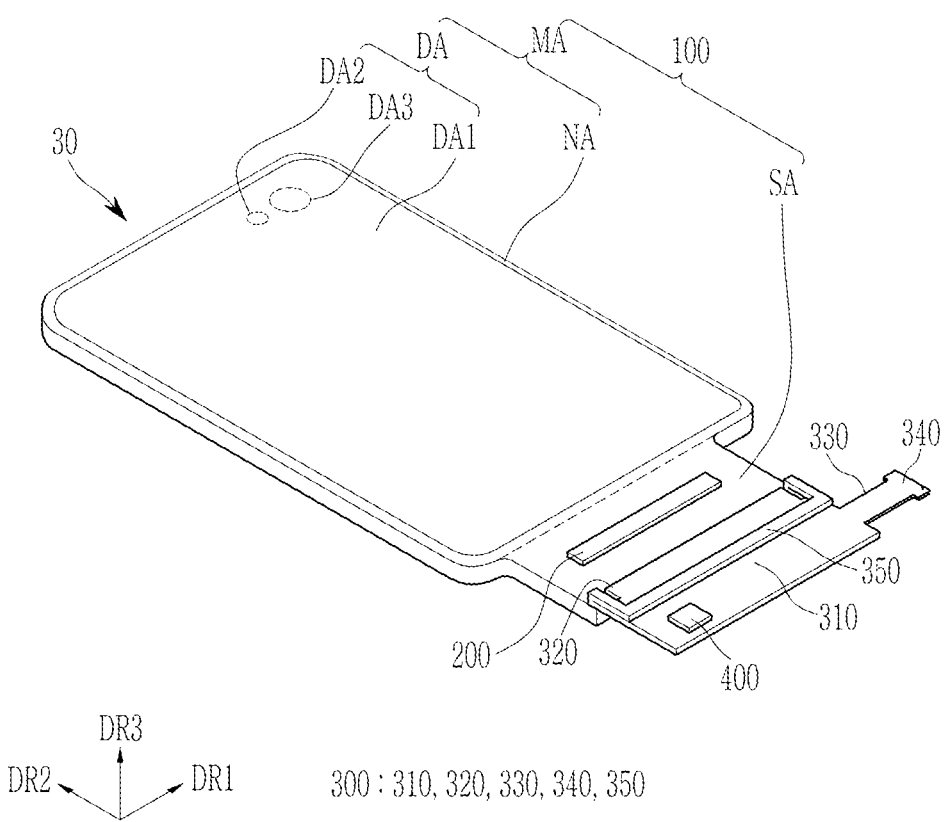
FIG. 2 is a schematic perspective view of a display device included in an electronic device according to an embodiment.

FIG. 1 is a schematic perspective view of an electronic device 1 according to an embodiment, and FIG. 2 is a schematic perspective view of a display device included in the electronic device according to an embodiment.

Referring to FIGS. 1 and 2, the electronic device 1 may include a display screen that may display an image in a third direction DR3 corresponding to the front on a plane defined by the first and second directions DR1 and DR2.

For example, examples of the electronic device 1 may include a mobile phone, a smart phone, a tablet PC, an electronic watch, a smart watch, a watch phone, a television, a laptop computer, a monitor, a head-mounted display (HMD), a mobile communication terminal, an electronic notebook, an e-book reader, a portable multimedia player (PMP), a navigation device, a game machine, a digital camera, a camcorder, a billboard, and the like.

The electronic device 1 may include a cover window 10, a housing 20, a display device 30, and the like.

The cover window 10 may include an insulating panel. For example, the cover window 10 may be made of glass, plastic, or a combination thereof. The front surface of the cover window 10 may define the front surface of the electronic device 1. A region of the cover window 10 corresponding to the display screen may be optically transparent. The cover window 10 may be positioned on the display device 30 to protect the display device 30 from external impact and transmit an image displayed by the display device 30.

The housing 20 may be made of, e.g., a material with relatively high rigidity. For example, the housing 20 may include frames and/or plates made of glass, plastic, or metal, or a combination thereof. The housing 20 can be combined with the cover window 10, and the combined housing 20 and cover window 10 can constitute the appearance or exterior of the electronic device 1 and provide an internal space of the electronic device 1. For example, the housing 20 may constitute the rear and side surfaces of the electronic device 1, and the cover window 10 may constitute the front surface of the electronic device 1. The display device 30 and the like may be positioned in the inner or internal space defined by the cover window 10 and the housing 20, and the display device 30 may be protected from the external environment.

The display device 30 may display an image and provide a display screen of the electronic device 1. The display device 30 may be a light emitting display device such as an organic light emitting display device, an inorganic light emitting display device, or a quantum dot light emitting display device.

The electronic device 1 may have various shapes. For example, as shown in FIG. 1, the electronic device 1 may be a quadrangle with rounded corners when viewed from the front. However, the embodiments are not limited thereto. For example, the electronic device 1 may have a shape such as a rectangle, a square, other polygons, a circle, an ellipse, or the like.

The electronic device 1 and the display device 30 may each include a display area DA and a non-display area NA. The display area DA and the non-display area NA shown in FIG. 1 may correspond to the display area DA and the non-display area NA of the display device 30 shown in FIG. 2. The display area DA may be an area in which an image is displayed and may correspond to the display screen. The non-display area NA may be an area in which an image is not displayed.

The display area DA may occupy most of the region on the center of the front surface of the electronic device 1, and the non-display area NA may be adjacent to or surround the display area DA. The display area DA may include a first display area DA1, a second display area DA2, and a third display area DA3. The second display area DA2 and the third display area DA3 may be areas in which components such as sensors and cameras for adding various functions to the electronic device 1 are disposed on a side, e.g., a rear side. The second display area DA2 and the third display area DA3 may correspond to component regions. The second display area DA2 and the third display area DA3 may be surrounded by the first display area DA1.

In addition to the first display area DA1, the second and third display areas DA2 and DA3 may display images. Positions and numbers of the second display area DA2 and the third display area DA3 may be variously changed.

In more detail, the display device 30 may provide a display screen in the electronic device 1. The display device 30 may detect or photograph the front surface of the electronic device 1. The display device 30 may have a planar shape similar to that of the electronic device 1.

The display device 30 may include a display panel 100, a display driver 200, a flexible printed circuit board 300, a touch driver 400, and/or the like.

The display panel 100 may include a main area MA and a sub-area SA.

The main area MA may include a display area DA in which pixels displaying an image are arranged, and a non-display area NA around the display area DA. The display area DA may include a first display area DA1, a second display area DA2, and a third display area DA3. A component such as a sensor or a camera may be disposed in the second display area DA2 (e.g., on the rear side of the second display area DA2) and the third display area DA3, and the second display area DA2 and the third display area DA3 correspond to component areas.

The display area DA may emit light from light emitting regions corresponding to the light emitting elements in the third direction DR3. For example, the display panel 100 may include a pixel circuit part including transistors, signal lines (e.g., gate lines, data lines, and voltage lines) connected to the pixel circuit part, and a light emitting element connected to the pixel circuit part. The display panel 100 may include a pixel definition layer having an opening defining a light emitting region of each light emitting element. Examples of the light emitting element may include an organic light emitting diode including an organic emission layer, a quantum dot light emitting diode including a quantum dot emission layer, an inorganic light emitting diode including an inorganic semiconductor, and/or a micro light emitting diode.

The non-display area NA may surround the display area DA. The non-display area NA may be defined as an edge region of the main area MA of the display panel 100. Circuits and/or signal lines for generating and/or transmitting various signals applied to the display area DA may be disposed in the non-display area NA. For example, in the non-display area NA, a gate driver (not shown) supplying gate signals to the gate lines, and fan-out lines (not shown) connecting the display driver 200 and the signal lines of the display area DA may be positioned.

The sub-area SA may be a region extending from one side of the main area MA. The sub-area SA may include a flexible region capable of being bent, folded, or rolled. For example, the sub-area SA may be bent to overlap the main area MA in the thickness direction (third direction DR3). The display driver 200 may be positioned in the sub-area SA, and a pad area may be positioned at an edge of the sub-area SA. The flexible printed circuit board 300 may be connected to the pad area. In another embodiment, the sub-area SA may be omitted, and the display driver 200 and the pad area may be disposed in the non-display area NA.

The display driver 200 may output signals and voltages for driving the display panel 100. The display driver 200 may supply data voltages to the data lines. The display driver 200 may supply power voltage to power lines, and may supply gate control signals to the gate driver. The display driver 200 may be provided as an integrated circuit chip, and may be mounted on the display panel 100. For example, the display driver 200 may be disposed in the sub-area SA and may overlap the main area MA in the thickness direction (e.g., third direction DR3) by bending the sub-area SA. In another embodiment, the display driver 200 may be mounted on the flexible printed circuit board 300.

The flexible printed circuit board 300 may include a body 310, a pressing portion 320, a tail 330, a connector 340, and/or a bypass portion 350. The body 310 may occupy the largest region of the flexible printed circuit board 300 and may be multi-layered. Components such as the touch driver 400, a capacitor, a resistor, and an inductor may be disposed on the body 310. The pressing portion 320 (also referred to as a pad area) may be positioned along an edge of the body 310. The tail 330 may extend from the body 310, and the connector 340 may be formed at an end of the tail 330. The pressing portion 320 may be bonded (or attached) to the pad area of the display panel 100 by using an anisotropic conductive film. Pads positioned on the pressing portion 320 of the flexible printed circuit board 300 may be electrically connected to pads positioned in the pad area of the display panel 100. The connector 340 may be connected to an external device such as a graphic system or a power system to receive digital video data and receive power. A mobile industry processor interface (MIPI) may be used for high-speed transmission of digital video data. The bypass portion 350 can be extended from the body 310 and may have a flat "⊏" shape. At least a portion of the bypass portion 350 may be bent to overlap the body 310. At least a portion of the bypass portion 350 may be attached to the body 310. Wires may be disposed on the body 310 and the tail 330, and the wires may be connected to components, terminals of the connector 340, and/or pads of the pressing portion 320. Wires may be disposed in the bypass portion 350, and wires of the bypass portion 350 may be connected to wires of the body 310.

The touch driver 400 may be provided as an integrated circuit chip, and may be mounted on the flexible printed circuit board 300. The touch driver 400 may be electrically connected to a touch sensing part included in the electronic device 1. The touch sensing part may be provided in the display area DA of the display panel 100. The touch driver 400 can supply input signals (touch drive signals) to the detection electrodes of the touch detection part, and based on the output signals (touch detection signals) from the detection electrodes, it can detect changes in the capacitance between the detection electrodes. For example, the touch driving signal may be a pulse signal having a frequency (e.g., a predetermined or selectable frequency). The touch driver 400 may calculate whether there is a touch and touch coordinates based on the amount of changes in capacitance between the sensing electrodes.

Figure 3:
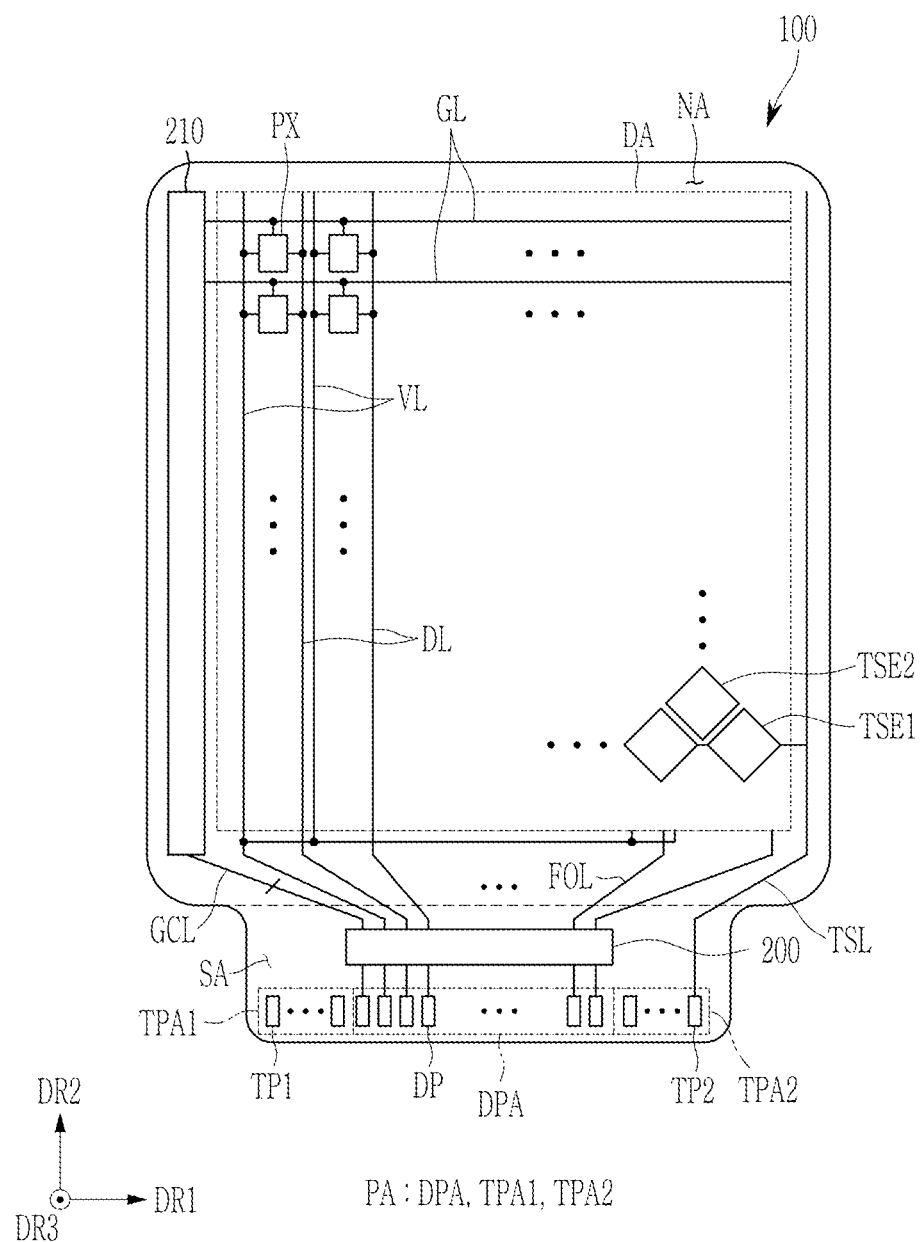
FIG. 3 is a schematic plan view schematically illustrating connections between components of a display device according to an embodiment.

FIG. 3 is a schematic plan view schematically illustrating connections between components of a display device according to an embodiment.

Referring to FIG. 3, the display panel 100 of the display device 30 may include a display area DA and a non-display area NA. The display area DA may be disposed at the center of the display panel 100. Unit pixels PX, gate lines GL, data lines DL, and power lines VL may be disposed in the display area DA. Each part pixel PX may be a minimum unit emitting light and may include a pixel circuit part including a transistor and a capacitor, and a light emitting element receiving a driving current from the pixel circuit part. The unit pixel PX may be connected to the gate line GL, the data line DL, and the power line VL.

The gate lines GL may supply the gate signal applied from a gate driver 210 to the unit pixels PX. The gate lines GL may extend in the first direction DR1, and may be spaced apart from each other in the second direction DR2. The data lines DL may supply the data voltage applied from the display driver 200 to the unit pixels PX. The data lines DL may extend in the second direction DR2, and may be spaced apart from each other in the first direction DR1. The power lines VL may supply power voltages applied from the display driver 200 to the unit pixels PX.

The power voltages may include a high-potential power voltage (or driving voltage), a low-potential power voltage (or common voltage), an initialization voltage, and the like, and these power voltages may be transmitted to the unit pixel PX. The power lines VL may extend in the second direction DR2, and may be spaced apart from each other in the first direction DR1. Sensing electrodes TSE1 and TSE2 that may sense a touch may be disposed in the display area DA. The sensing electrodes TSE1 and TSE2 may include first sensing electrodes TSE1 arranged in the first direction DR1 and second sensing electrodes TSE2 arranged in the second direction DR2.

The non-display area NA may surround the display area DA. The gate driver 210, fan-out lines FOL, gate control lines GCL, touch signal lines TSL, and the like may be disposed in the non-display area NA. The gate driver 210 may generate gate signals based on the gate control signals, and may supply the gate signals to the gate lines GL according to a set order. The fan-out lines FOL may extend from the display driver 200 to the display area DA. The fan-out lines FOL may transfer the data voltages output from the display driver 200 to the data lines DL. The gate control lines GCL may extend from the display driver 200 to the gate driver 210. The gate control lines GCL may transmit gate control signals output from the display driver 200 to the gate driver 210. The touch signal lines TSL may electrically connect touch pads TP1 and TP2 and the sensing electrodes TSE1 and TSE2.

The display panel 100 may include a sub-area SA. The display driver 200 may be positioned in the sub-area SA. The sub-area SA may include a pad area PA.

The display driver 200 may output signals and voltages for driving the display panel 100. The display driver 200 may supply data voltages to the data lines DL through the fan-out lines FOL. The data voltages may be supplied to the unit pixels PX and may control luminance of the unit pixels PX. The display driver 200 may supply gate control signals to the gate driver 210 through the gate control lines GCL.

The pad area PA may be disposed at an edge of the sub-area SA. The pad area PA may include a display pad area DPA, a first touch pad area TPA1, and a second touch pad area TPA2. Display pads DP may be disposed in the display pad area DPA. The display pads DP may be connected to the graphic system through the flexible printed circuit board 300. The display pads DP may be connected to the flexible printed circuit board 300 to receive digital video data and to supply the digital video data to the display driver 200. The first touch pad area TPA1 and the second touch pad area TPA2 may be positioned at one side and another side of the display pad area DPA, respectively. Touch pads TP1 and TP2 may be disposed in the first and second touch pad areas TPA1 and TPA2, and the touch pads TP1 and TP2 may be connected to touch electrodes TSE1 and TSE2 positioned in the display area DA and the touch driver 400 positioned on the flexible printed circuit board 300 to sense a touch. The pad area PA, the first touch pad area TPA1, and the second touch pad area TPA2 may be connected to the flexible printed circuit board 300 by an anisotropic conductive film (ACF) or a self-assembly anisotropic conductive paste (SAP).

Figure 4:
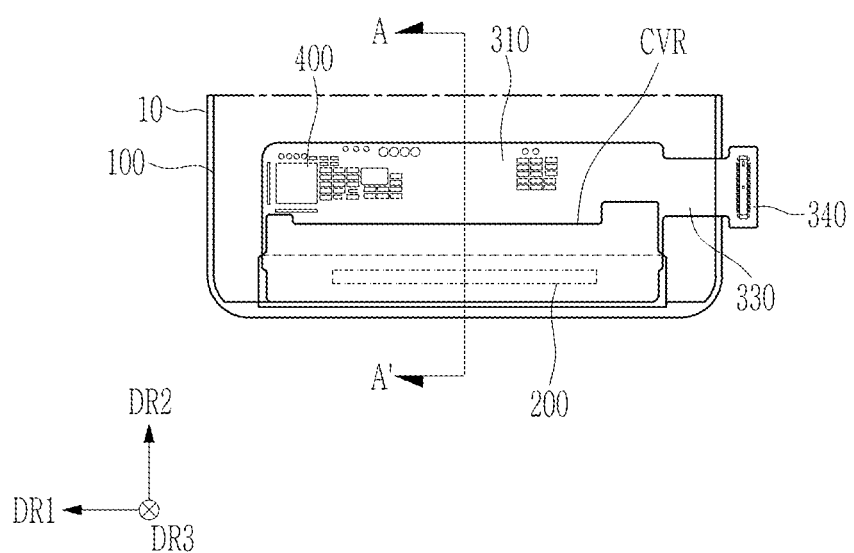
FIG. 4 is a schematic rear view of a display device according to an embodiment.
Figure 5:
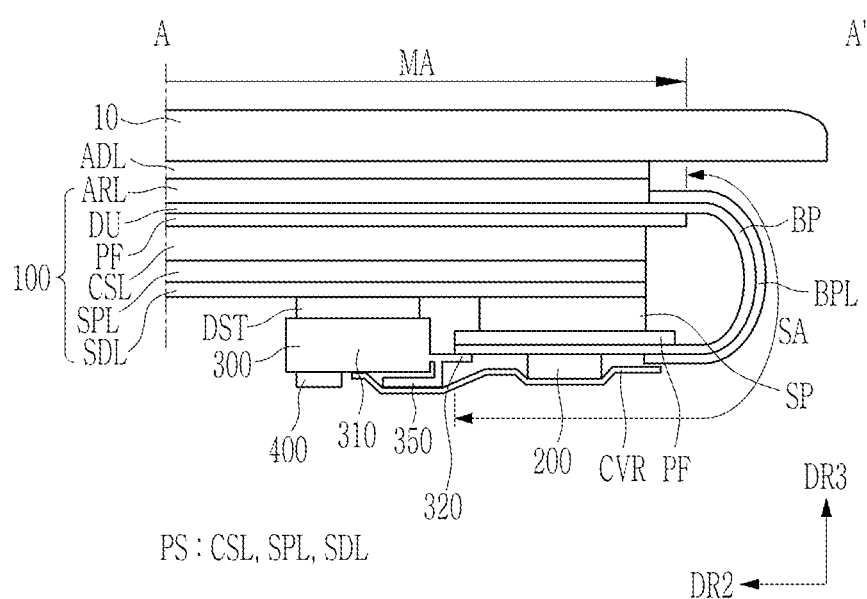
FIG. 5 is a schematic cross-sectional view taken along line A-A' in FIG. 4.

FIG. 4 is a schematic rear view of a display device according to an embodiment, and FIG. 5 is a schematic cross-sectional view taken along line A-A' in FIG. 4.

FIGS. 4 and 5 illustrate the sub-area SA of the display panel 100 and an area in which the flexible printed circuit board 300 is positioned in the display device according to an embodiment. The display panel 100 may be attached to the cover window 10 by an adhesive layer ADL such as an optically clear adhesive (OCA).

The sub-area SA of the display panel 100 may include a bending portion BP, the bending portion BP may be bent so that a portion of the sub-area SA is positioned on the rear surface of the main area MA, and the display driver 200 positioned in the sub-area SA may be positioned on the rear surface of the main area MA. In order to maintain the bent state of the sub-area SA, the sub-area SA may be attached to the rear surface of the main area MA by a spacer SP including an adhesive layer on sides thereof or a double-sided adhesive tape. The flexible printed circuit board 300 in which the pressing portion 320 is bonded to the pad area PA of the sub-area SA may be positioned on the rear surface of the main area MA as the sub-area SA is bent. The body 310 of the flexible printed circuit board 300 may be attached to the rear surface of the main area MA by a double-sided adhesive tape DST or a spacer SP including an adhesive layer on the sides. The bypass portion 350 of the flexible printed circuit board 300 may be bent so that at least a portion thereof may be positioned under the body 310 to overlap the body 310.

At least portions of the display driver 200, the sub-area SA, and the flexible printed circuit board 300 may be covered by a cover CVR. The cover CVR may be attached to the display driver 200, the sub-area SA, and the flexible printed circuit board 300. The cover CVR may be applied to cover the at least portions of the display driver 200 and the flexible printed circuit board 300 to protect them from electromagnetic interference (EMI) and electrostatic discharge (ESD). The cover CVR can prevent the display driving part 200 and the pressing portion 320 from directly contacting an external object, thereby protecting them from physical damage due to friction or the like. The bypass portion 350 of the flexible printed circuit board 300 may be positioned between the body 310 and the cover CVR. The cover CVR can press the bypass portion 350 of the flexible printed circuit board 300 so that the bypass portion 350 can be maintained in a bent state. The cover CVR may be made of a flexible material capable of blocking or shielding from EMI, ESD, and the like. For example, the cover CVR may have a tape shape including a metal layer. The metal layer of the cover CVR may include a metal foil, a metal fabric, a metal mesh, or the like. An adhesive layer may be positioned on one surface of the cover CVR. For example, an adhesive may be applied to, or a double-sided tape may be attached to, one surface of the cover CVR.

Describing the schematic laminated structure of the display panel 100, the display panel 100 may include a display part or display unit (hereinafter "display part") DU, a touch sensing part or touch sensing unit (hereinafter "touch sensing part") (not shown) and a reflection reduction layer ARL disposed on the display part DU, and a protective film PF and a protective sheet PS positioned under the display part DU.

The display part DU may include a substrate and a driving element layer, a light emitting element layer, and an encapsulation layer disposed on the substrate.

The substrate may be a base substrate or base member. The substrate may be a flexible substrate including a polymer resin such as polyimide, polyamide, polyethylene terephthalate, etc. The substrate may be a rigid substrate made of a material such as glass. The driving element layer may be positioned on the substrate. The driving element layer may include transistors and capacitors constituting pixel circuit parts that output driving currents to the light emitting elements.

The driving element layer may include gate lines, data lines, power lines, gate control lines, fan-out lines connecting the display driver 200 and the data lines, lead lines connecting the display driver 200 and the display pads DP, etc. The driving element layer may include transistors and capacitors constituting the gate driving part, and gate control lines. The driving element layer may include conductive layers, semiconductor layers, and insulating layers, and transistors, capacitors, a combination of which may constitute signal lines and/or may insulate elements.

The light emitting element layer may be positioned on the driving element layer and may include light emitting elements and light emitting regions corresponding thereto. The light emitting element layer may include a pixel definition layer having openings defining light emitting regions.

The encapsulation layer (also referred to as a thin film encapsulation layer) may cover or overlap the upper and side surfaces of the light emitting element layer, and may prevent moisture or oxygen from penetrating into the light emitting element layer from the outside. The encapsulation layer may include at least one inorganic layer and/or at least one organic layer.

The touch sensing part may include an encapsulation layer, and may include sensing electrodes TSE1 and TSE2. The sensing electrodes TSE1 and TSE2 may sense a user's touch by a mutual capacitor method and/or a self-capacitor method.

The reflection reduction layer ARL can reduce the amount of light incident on the display panel 100 from the outside and reflected by the display panel 100.

The reflection reduction layer ARL may include a polarization layer. The reflection reduction layer ARL may include a combination of a color filter and a light blocking member instead of a polarization layer.

The protective film PF may be attached to the rear surface of the substrate SB and may protect the display panel 100 during the manufacturing process of the display device 30. The protective film PF may not be positioned on the bent portion BP of the sub-area SA. A bending protection layer BPL (or a stress neutralization layer) may be positioned on the bending portion BP to relieve stress of a wire positioned in the bending portion BP.

The protective sheet PS may be attached to the rear surface of the protective film PF, and may protect the display panel 100 from an environment on the rear surface of the display panel 100 (e.g., impact, electromagnetic waves, heat or noise). The protective sheet PS may be positioned in the main area MA, and may not be positioned in the sub-area SA. The protective sheet PS may have a structure in which a shielding layer SDL, a support layer SPL, and a cushion layer CSL are stacked each other.

The shielding layer SDL may prevent electromagnetic interference (EMI) or the like from flowing into the display panel 100 from the rear surface of the display panel 100. The shielding layer SDL may be a metal layer including a metal having excellent thermal conductivity as well as shielding performance, such as copper or aluminum.

The support layer SPL may be provided to secure strength of the protection sheet PS and couple/separate the cushion layer CSL with/from other layers or members. For example, the support layer SPL may be a plastic layer made of a polymer such as polyethylene terephthalate (PET) or polyimide (PI).

The cushion layer CSL may absorb shock and prevent the display panel 100 from being damaged. For example, the cushion layer CSL can prevent damage to the display panel 100 caused by external shock and can relieve shock and stress in case that the electronic device 1 is dropped. The cushion layer CSL may be a porous layer formed of a material such as polyurethane or polyethylene. The cushion layer CSL may include a foam resin.

An adhesive layer such as pressure sensitive adhesive PSA may be positioned between the shielding layer SDL and the support layer SPL, and between the support layer SPL and the cushion layer CSL to attach them. The protective sheet PS may further include functional layers such as a light blocking layer and a heat dissipation layer in addition to the above-described layers.

Figure 6:
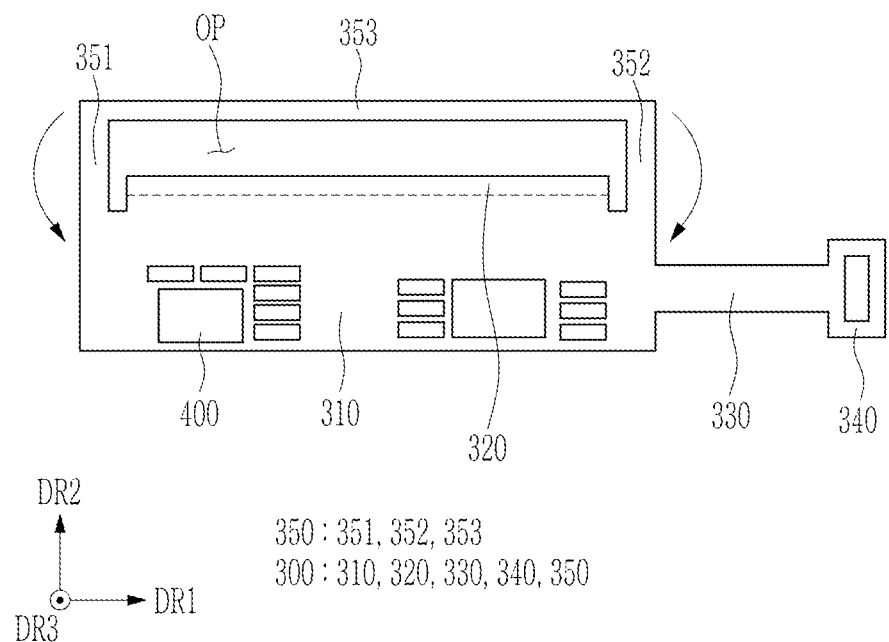
FIG. 6 and FIG. 7 are drawings schematically illustrating a flexible printed circuit board in a display device according to an embodiment.
Figure 7:
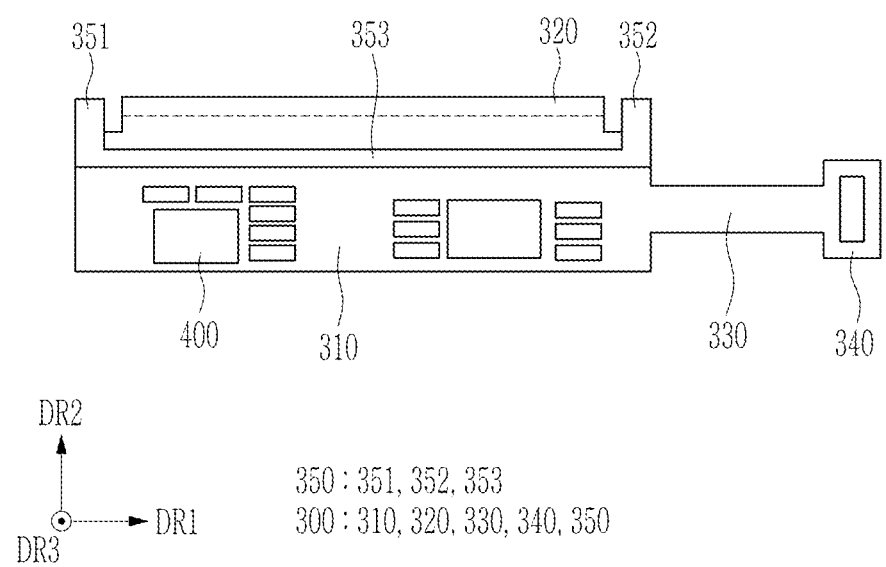

FIGS. 6 and 7 are drawings schematically illustrating a flexible printed circuit board in the display device according to an embodiment.

In FIGS. 6 and 7, the flexible printed circuit board 300 may include a body 310, a pressing portion 320, a tail 330, a connector 340, and/or a bypass portion 350. FIG. 6 illustrates a state before the bypass portion 350 is bent, and FIG. 7 illustrates a state after the bypass portion 350 is bent.

The body 310 may have a multi-layered structure as a portion where wires are disposed in the flexible printed circuit board 300. For example, the body 310 may include two or more layers, three or more layers, or four or more conductive layers. The conductive layers may include, for example, a conductive layer including a wire that transmits digital video data, a conductive layer including a wire that transmits power, a conductive layer including a ground layer, a conductive layer including terminals on which components are mounted, or the like. The touch driver 400 may be mounted on the body 310. Components such as capacitors, resistors, inductors, transistors, and power modules may be mounted on the body 310. The body 310 may occupy the largest area of the flexible printed circuit board 300 and may have a substantially quadrangular planar shape as a whole. Depending on the display device 30, the body 310 may have a recessed portion on at least one side thereof in a plan view, or may have a hole formed therein.

The pressing portion 320 may be positioned along one edge of the body 310. The pressing portion 320 may overlap the pad area PA of the display panel 100 with an electrical and physical connection member such as an anisotropic conductive layer interposed therebetween. The pressing portion 320 may be compressed by a pressing tool and may be bonded to the pad area PA of the panel 100. Pads may be positioned on a surface of the pressing portion 320, and the pads of the pressing portion 320 may be electrically connected to wires of the body 310. Pads of the pressing portion 320 may be electrically connected to pads positioned in the pad area PA of the display panel 100 by a connecting member. The pressing portion 320 may include one or more conductive layers. The conductive layer of the pressing portion 320 may include pads. The number of conductive layers included in the pressing portion 320 may be less than the number of conductive layers included in the body 310. For example, the pressing portion 320 may include one or two conductive layers, and the body 310 may include four or more conductive layers.

The tail 330 may extend from the body 310. The tail 330 may extend substantially in the first direction DR1 from one of the four sides of the body 310. The tail 330 may include at least one conductive layer. The conductive layer of the tail 330 may include a wire, and the wire of the tail 330 may electrically connect the body 310 and the connector 340. The number of conductive layers included in the tail 330 may be less than the number of conductive layers included in the body 310. For example, the tail 330 may include one or two conductive layers, and the body 310 may include four or more conductive layers. The tail 330 may be substantially straight on a plane, but may be bent one or more times.

The connector 340 may be positioned at an edge of the tail 330. The connector 340 may include connection terminals connected to wires of the tail 330. The connector 340 may be connected to an external device such as a graphic system, a power system, or the like to receive digital video data. The connector 340 may receive power. Signals and power applied through the connector 340 may be transferred to wires disposed in the body 310 through wires disposed in the tail 330.

The bypass portion 350 as a whole may have a planar shape such as "⊏". The bypass portion 350 may be bent two or more times. The bypass portion 350 may include leg portions 351 and 352 and a connection portion 353. The leg portions 351 and 352 may include a first leg portion 351 extending from one side of the body 310 and a second leg portion 352 extending from another side of the body 310. A portion of the first leg portion 351 connected to the body 310 may be one end of the bypass portion 350, and a portion of the second leg portion 352 connected to the body 310 may be another end of the bypass portion 350. The first leg portion 351 and the second leg portion 352 may respectively extend from one edge and another edge of one of the four sides of the body 310 in the same direction—for example, in the second direction DR2. The first leg portion 351 and the second leg portion 352 may extend on a side different from the side where the tail 330 extends among the four sides of the body 310. The connection portion 353 may be connected between the first leg portion 351 and the second leg portion 352. For example, one end of the connection portion 353 may be connected to the first leg portion 351 and another end of the connection portion 353 may be connected to the second leg portion 352. The connection portion 353 may be integral with the first leg portion 351 and the second leg portion 352.

The connection portion 353 may extend substantially in the first direction DR1.

The connection portion 353 may extend substantially parallel to the pressing portion 320. As the bypass portion 350 is formed in this way, the flexible printed circuit board 300 may include an opening OP or a slit formed between the body 310 and the bypass portion 350. A planar shape of the opening OP may be approximately a "⊏" shape.

The bypass portion 350 may include at least one conductive layer. The conductive layer of the bypass portion 350 may include wires, and the wires of the bypass portion 350 may be electrically connected to the wires of the body 310. The wires of the bypass portion 350 may transmit a signal sensitive to noise or a signal that may affect such a sensitive signal. For example, the wire of the bypass portion 350 may transmit a touch driving signal and/or a touch detection signal (hereinafter simply referred to as a touch signal). When a touch signal output from the touch driver 400 and input to the touch driver 400 interferes with other signals (e.g., digital video data or a power signal), an error in touch detection may occur, such as a ghost touch. Bypassing these sensitive signals through the bypass portion 350 may be advantageous in preventing interference with wires transmitting other signals. Since the number of layers of the flexible printed circuit board 300 can be reduced, the thickness of the flexible printed circuit board 300 can be partially reduced, and the manufacturing cost of the flexible printed circuit board 300 can be reduced. As another example, a touch signal may be transmitted through a wire of the body 310, and a power signal, digital video data, and the like may be transmitted through a wire of the bypass portion 350.

The number of conductive layers included in the bypass portion 350 may be equal to or less than the number of conductive layers included in the pressing portion 320. For example, the bypass portion 350 may include two conductive layers, and the pressing portion 320 may include one or two conductive layers. The number of conductive layers included in the bypass portion 350 may be less than the number of conductive layers included in the body 310. For example, the bypass portion 350 may include one or two conductive layers, and the body 310 may include four or more conductive layers.

The bypass portion 350 may be bent as shown in FIG. 7, and the connection portion 353 may be attached to the body 310. The connection part 353 may be attached to a surface of the body 310 on which the touch driver 400 is mounted. As another example, the connection part 353 may be attached to a surface of the body 310 on which the touch driver 400 is not mounted. A portion of the first leg portion 351 and a portion of the second leg portion 352 may be bent so that the bypass portion 350 is bent. The bypass portion 350 may be bent so as not to protrude beyond the pressing portion 320 in the second direction DR2. As the bypass portion 350 is bent, it may be possible to prevent the planar area of the flexible printed circuit board 300 from increasing due to the bypass portion 350. Bending and attaching the bypass portion 350 may be performed before, during, or after bonding of the flexible printed circuit board 300 to the display panel 100.

Figure 8A:
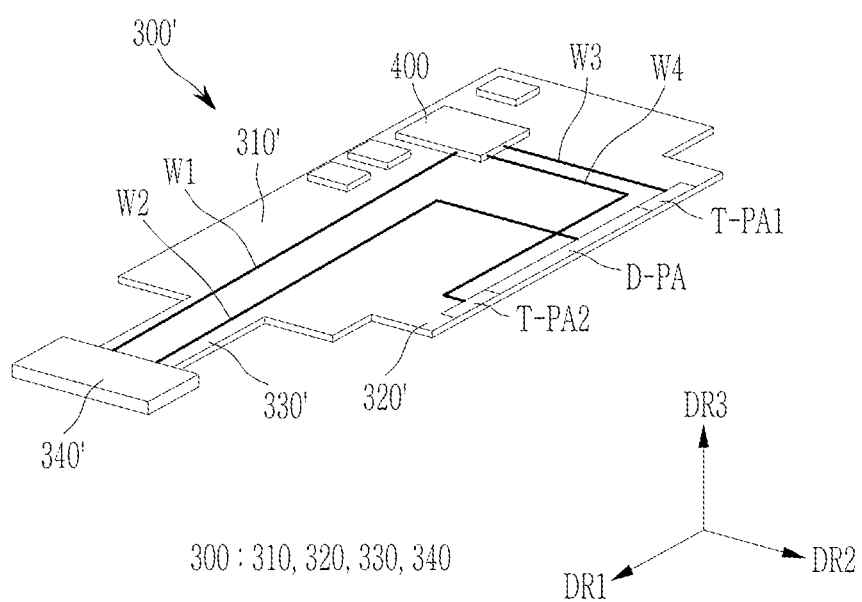
FIG. 8A and FIG. 8B are schematic perspective views schematically illustrating a flexible printed circuit board according to a comparative example and a flexible printed circuit board according to an embodiment, respectively.
Figure 8B:
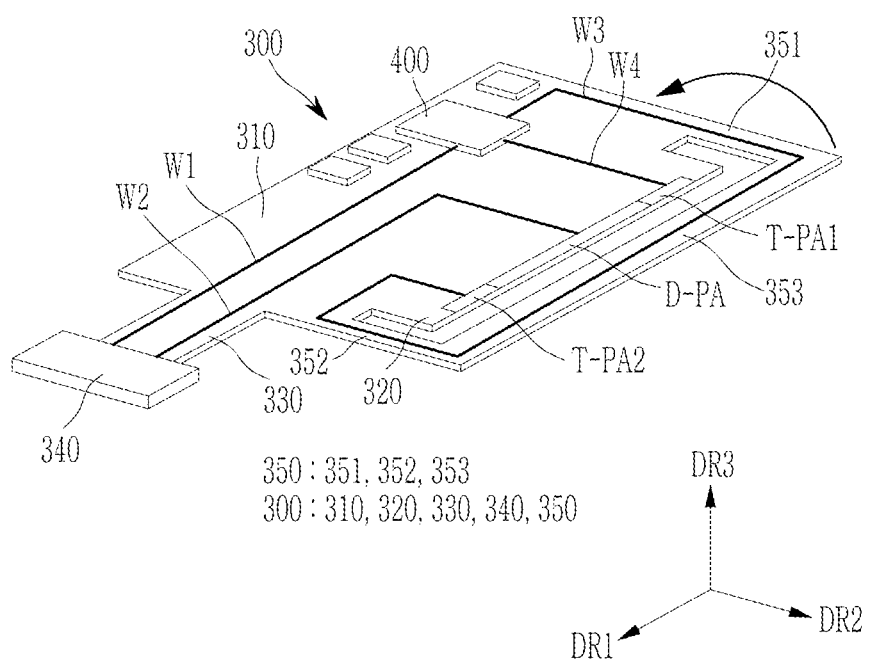

FIGS. 8A and 8B are perspective views schematically illustrating a flexible printed circuit board according to a comparative example and a flexible printed circuit board according to an embodiment, respectively.

Referring to FIGS. 8A and 8B, a flexible printed circuit board 300' according to the comparative example includes a body 310', a pressing portion 320', a tail 330', and a connector 340'. Compared to the flexible printed circuit board 300 according to an embodiment, the flexible printed circuit board 300' may not include a portion corresponding to the bypass portion 350. Instead, the body 310' of the flexible printed circuit board 300' may have a greater number of layers and a greater thickness than the body 310 of the flexible printed circuit board 300. For example, the body 310' may have six layers, and the body 310 may have four layers.

Referring to FIG. 8A, signals related to a touch among signals input through the connector 340' in the flexible printed circuit board 300' may be transmitted to the touch driver 400 through a wire W1 disposed on the tail 330' and the body 310'. Signals related to video display among signals input through the connector 340' can be transmitted to the pads in a display pad region D-PA through a wire W2 positioned in the tail 330' and the body 310'. The touch driver 400 may be connected to pads of a first touch pad region T-PA1 through a wire W3 disposed on the body 310' and may be connected to pads of a second touch pad region T-PA2 through a wire W4 disposed on the body 310'. Here, the display pad region D-PA, the first touch pad region T-PA1, and the second touch pad region T-PA2 may correspond to the aforementioned display pad area DPA, the first touch pad area TPA1, and the second touch pad area TPA2, and pads positioned in the display pad region D-PA, the first touch pad region T-PA1, and the second touch pad region T-PA2 may be connected to pads positioned in the display pad area DPA, the first touch pad area TPA1, and the second touch pad area TPA2, respectively. The wire W4 connecting the touch driver 400 and the second touch pad region T-PA2 may be positioned on a different conductive layer from the wire W2 connecting the connector 340' and the display pad region D-PA, and the wires W4 and W2 can overlap each other. In order to prevent interference of signals transmitted through the wires W2 and W4, a ground layer may be disposed between the wires W2 and W4 to shield them. Since a conductive layer forming or including a ground layer for preventing signal interference is required, it may be difficult to reduce the number of layers of the flexible printed circuit board 300'.

Referring to FIG. 8B, signals related to a touch among signals input through the connector 340 in the flexible printed circuit board 300 may be transmitted to the touch driver through a wire W1 disposed in or on the tail 330 and the body 310. Signals related to image display among signals input through the connector 340 may be transmitted to the pads in the display pad region D-PA through the wire W2 arranged in or on the tail 330 and the body 310. The touch driver 400 may be connected to the pads of the first touch pad region T-PA1 through a wire W3 disposed on the body 310, and may be connected to the pads of the second touch pad region T-PA2 through the wire W4 disposed in or on the body 310 and the bypass portion 350. One of the wires W3 and W4 may transmit a touch driving signal, and the other may transmit a touch sensing signal. Since the wire W4 connecting the touch driver 400 and the second touch pad region T-PA2 may be bypassed by the bypass portion 350, the wire W4 may not overlap the wire W2. Therefore, since the body 310 does not have to include a ground layer for preventing interference of signals transmitted through the wires W2 and W4, the number of layers may be reduced compared to the flexible printed circuit board 300' according to the comparative example.

Figure 9:
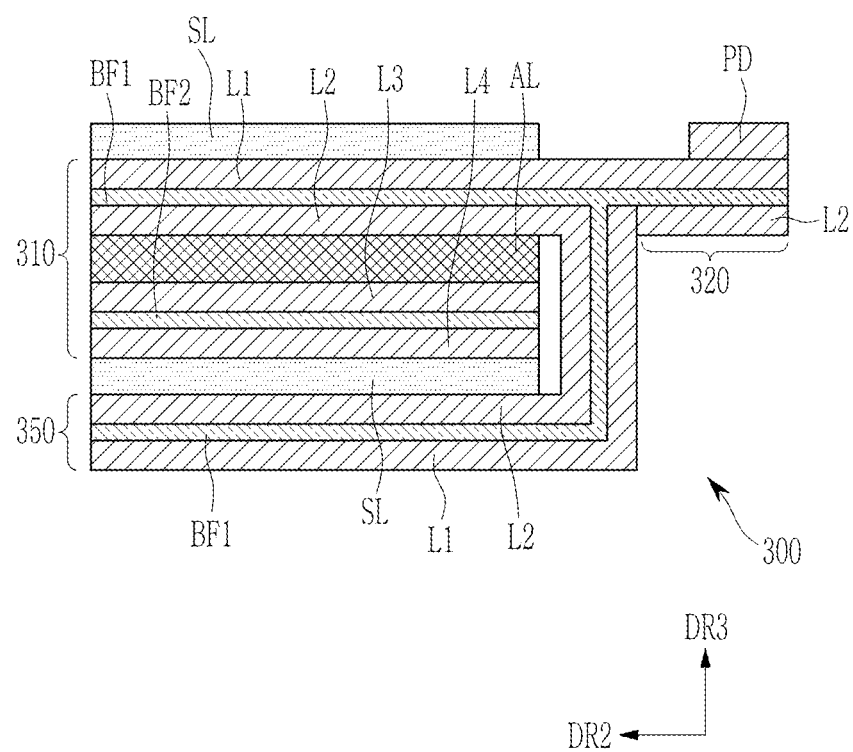
FIG. 9 and FIG. 10 each schematically illustrate a cross-sectional structure of a flexible printed circuit board according to an embodiment in a state in which a bypass portion is bent.
Figure 10:
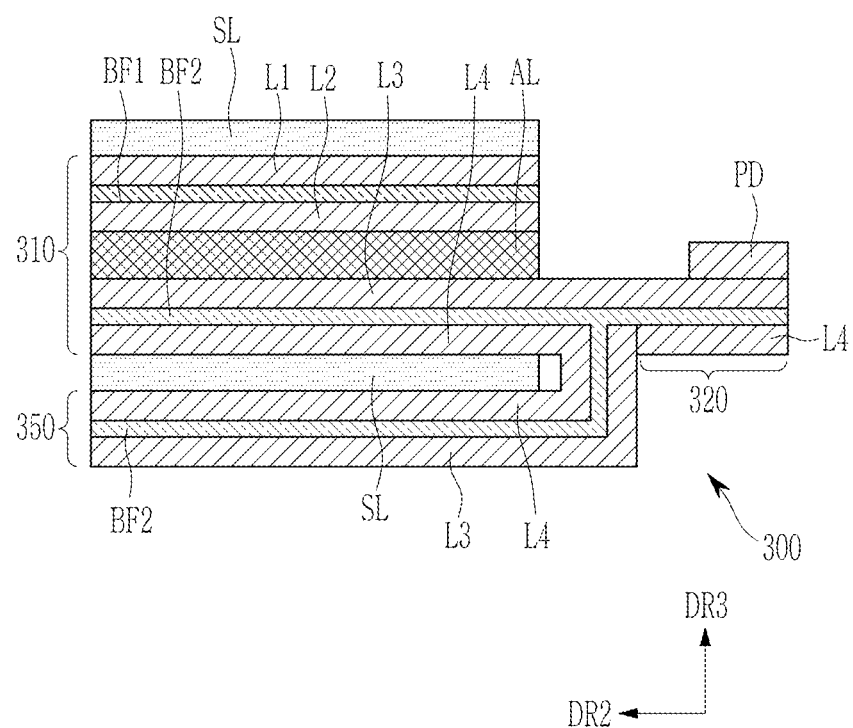

FIGS. 9 and 10 each schematically illustrate a cross-sectional structure of a flexible printed circuit board according to an embodiment in a state in which a bypass portion is bent.

Referring to FIGS. 9 and 10, a laminated structure of the flexible printed circuit board 300 shown in FIG. 5 is shown. As shown in FIG. 5, the direction of the flexible printed circuit board 300 may be based on a state in which the flexible printed circuit board 300 is bonded to the display panel 100 and the sub-area SA is bent. The flexible printed circuit board 300 may include first to fourth conductive layers L1-L4. The first and second conductive layers L1 and L2 may be formed on sides of a base film BF1, and the third and fourth conductive layers L3 and L4 may be formed on sides of a base film BF2. The first to fourth conductive layers L1-L4 may include a metal such as copper, and the base films BF1 and BF2 may include a polymer such as polyimide. In this way, by forming the conductive layers L1-L4 on the sides of the base films BF1 and BF2, the wire density per unit area can be increased. Unlike the illustration, the conductive layer may be formed on only one side of the base films BF1 and BF2. A unit in which first and second conductive layers L1 and L2 are formed on the sides of the base film BF1 and a unit in which third and fourth conductive layers L3 and L4 are formed on the sides of the base film BF2 may be laminated by an adhesive layer AL.

The body 310 may include all of the first to fourth conductive layers L1-L4. The pressing portion 320 including a pad PD may include first and second conductive layers L1 and L2 as shown in FIG. 9 or third and fourth conductive layers L3 and L4 as shown in FIG. 10. The bypass portion 350 and the pressing portion 320 may include a same conductive layer. The bypass portion 350 may include the first and second conductive layers L1 and L2 as illustrated in FIG. 9, or may include the third and fourth conductive layers L3 and L4 as illustrated in FIG. 10.

The bypass portion 350 may be bent so that at least a portion of the bypass portion 350 (particularly the connection portion 353) may be positioned under the fourth conductive layer L4 of the body 310. Since the second conductive layer L2 or the fourth conductive layer L4 of the bypass portion 350 is adjacent to and overlaps the fourth conductive layer L4 of the body 310, a shielding layer SL may be positioned between the bypass portion 350 and the body 310 to prevent interference between the fourth conductive layer L4 of the body 310 and the second conductive layer L2 or the fourth conductive layer L4 of the bypass portion 350. The shielding layer SL may include a metal layer such as a copper layer. To block external noise, the shielding layer SL may be positioned on the first conductive layer L1 of the body 310. To fix the position of the bent bypass portion 350, the bypass portion 350 may be attached to the shielding layer SL.

In the bypass portion 350 shown in FIG. 9, the second conductive layer L2 relatively adjacent to the body 310 may include a wire that transmits a touch signal, etc., and the first conductive layer L1 positioned relatively far away from the body 310 may include a ground layer that blocks external noise. Similarly, in the bypass portion 350 shown in FIG. 10, the fourth conductive layer L4 may include a wire transmitting a touch signal, etc., and the third conductive layer L3 may include a ground layer blocking external noise.

By bending the bypass portion 350, the body 310 may have a six-layered structure in some areas. However, since a typical 6-layer flexible printed circuit board requires that three units having conductive layers formed on sides of a base film be laminated, two lamination processes may be required. Since the flexible printed circuit board 300 according to the embodiment requires only one lamination process, it may be possible to reduce processes and costs in manufacturing the flexible printed circuit board 300. In a typical 6-layer flexible printed circuit board, components such as the touch driver 400 may be mounted on the 6-layer body, but in the flexible printed circuit board 300 according to the embodiment, components may be mounted on a 4-layer body. Thus, the overall thickness of the flexible printed circuit board 300 and components mounted thereon can be reduced, and the thickness of the electronic device 1 can be reduced. In addition, as described above, even if the wire W4 for transmitting the touch signal is disposed on the bypass portion 350 and the bypass portion 350 overlaps the body 310, the bypass portion 350 may be shielded from the body 310 by the shielding layer SL. Therefore, it may be possible to prevent noise from entering the touch signal. Therefore, the 4-layer flexible printed circuit board 300 according to an embodiment and the 6-layer flexible printed circuit board can perform a same function.

Figure 11:
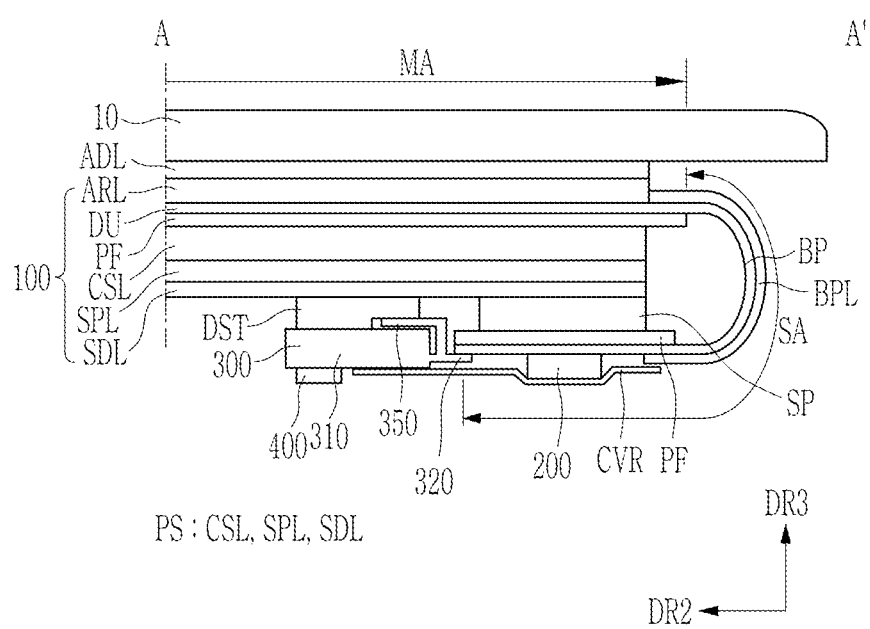
FIG. 11 is a schematic cross-sectional view taken along line A-A' in FIG. 4.

FIG. 11 is a schematic cross-sectional view taken along line A-A' in FIG. 4.

The embodiment shown in FIG. 11 may be different from the embodiment shown in FIG. 5 in the direction in which the bypass portion 350 of the flexible printed circuit board 300 is bent. The bypass portion 350 may be bent to be positioned between the body 310 and the main area MA. The bypass portion 350 may be bent so that at least a portion of the bypass portion 350 is positioned on a surface (e.g., on the body 310 in FIG. 11) opposite to the surface of the body 310 on which the touch driver 400 is positioned. The bypass portion 350 may be attached to the body 310. Since the bypass portion 350 is sandwiched between the body 310 and the double-sided adhesive tape DST that attaches the body 310 to the main region MA, the double-sided adhesive tape DST can press the bypass portion 350 to keep the bypass portion 350 bent.

Figure 12:
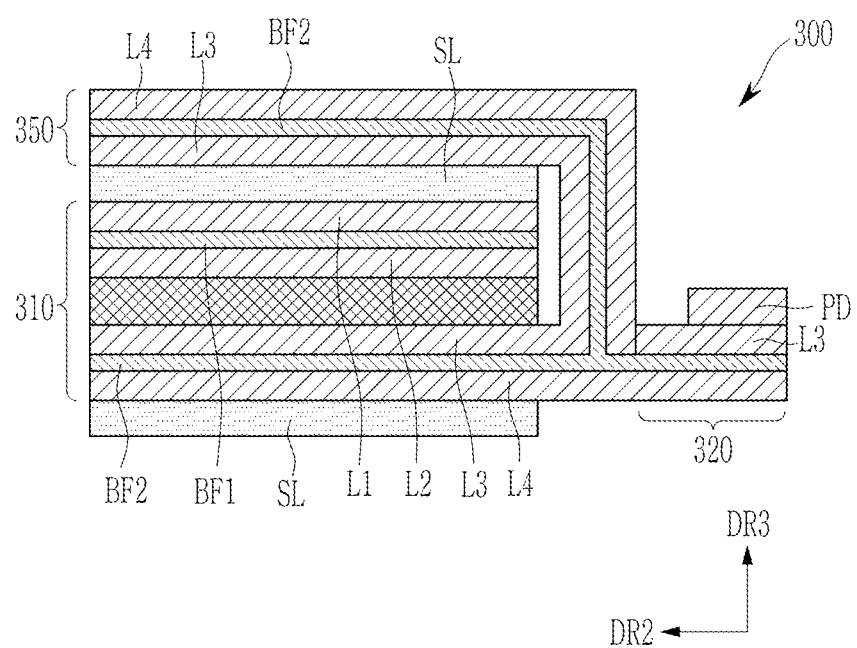
FIG. 12 and FIG. 13 each schematically illustrate a cross-sectional structure of a flexible printed circuit board according to an embodiment in a state in which a bypass portion is bent.
Figure 13:
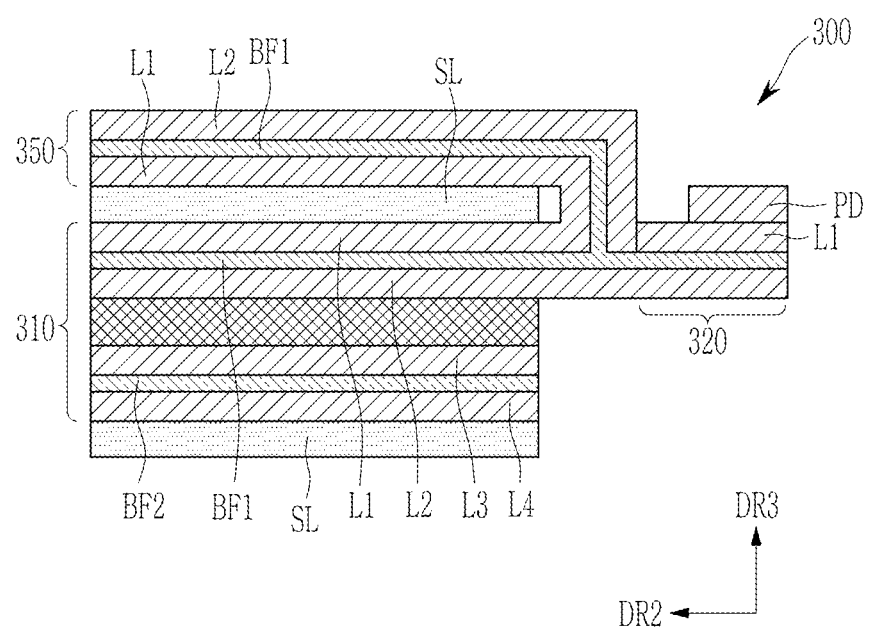

FIGS. 12 and 13 each schematically illustrate a cross-sectional structure of a flexible printed circuit board according to an embodiment in a state in which a bypass portion is bent.

Referring to FIGS. 12 and 13, a laminated structure of the flexible printed circuit board 300 shown in FIG. 11 is shown. As shown in FIG. 11, the direction of the flexible printed circuit board 300 may be based on a state in which the flexible printed circuit board 300 is bonded to the display panel 100 and the sub-area SA is bent, and the circuit board 300 may include first to fourth conductive layers L1-L4. The flexible printed circuit board 300 can have a structure in which units in each of which first and second conductive layers L1 and L2 are formed on sides of a base film BF1 and units in which third and fourth conductive layers L3 and L4 are formed on sides of abase film BF2 are laminated by an adhesive layer AL. The embodiments shown in FIGS. 12 and 13 may be different from the embodiments shown in FIGS. 9 and 10 in the direction in which the bypass portion 350 is bent. For example, the bypass portion 350 may be bent so that at least a portion of the bypass portion 350 (particularly, the connection portion 353) may be positioned on the first conductive layer L1 of the body 310. Since the third conductive layer L3 or the first conductive layer L1 of the bypass portion 350 is adjacent to and overlaps the first conductive layer L1 of the body 310, a shielding layer SL may be positioned between the bypass portion 350 and the body 310 to prevent interference between the first conductive layer L1 of the body 310 and the third conductive layer L3 or the first conductive layer L1 of the bypass portion 350. To block external noise, a shielding layer SL may be positioned under the fourth conductive layer L4 of the body 310. To fix the position of the bent bypass portion 350, the bypass portion 350 may be attached to the shielding layer SL. The shielding layer SL between the bypass portion 350 and the body 310 may be a double-sided tape having an adhesive layer on sides thereof.

In the bypass portion 350 shown in FIG. 12, the third conductive layer L3 may include a wire for transmitting a touch signal and the like, and the fourth conductive layer L4 may include a ground layer for blocking external noise. Similarly, in the bypass portion 350 positioned in FIG. 12, the second conductive layer L2 may include wires for transmitting touch signals, and the first conductive layer L1 may include a grounding layer that blocks external noise.

By configuring the flexible printed circuit board 300 in this way, even though it may be a 4-layer flexible printed circuit board 300, the 4-layer flexible printed circuit board 300 and the 6-layer flexible printed circuit board can perform a same function, and the manufacturing process and manufacturing cost of the flexible printed circuit board can be reduced.

Although embodiments in which the body 310 of the flexible printed circuit board 300 may be four layers and the bypass portion 350 may have two layers have been described, the number of layers may be variously changed. For example, the body 310 may have two, three, five, or six layers, and the bypass portion 350 may have one layer or three layers. The number of layers of the bypass portion 350 may be designed to be smaller than the number of layers of the body 310 so that components can be firmly mounted on the body 310 and the bypass portion 350 can be easily bent.

Figure 14:
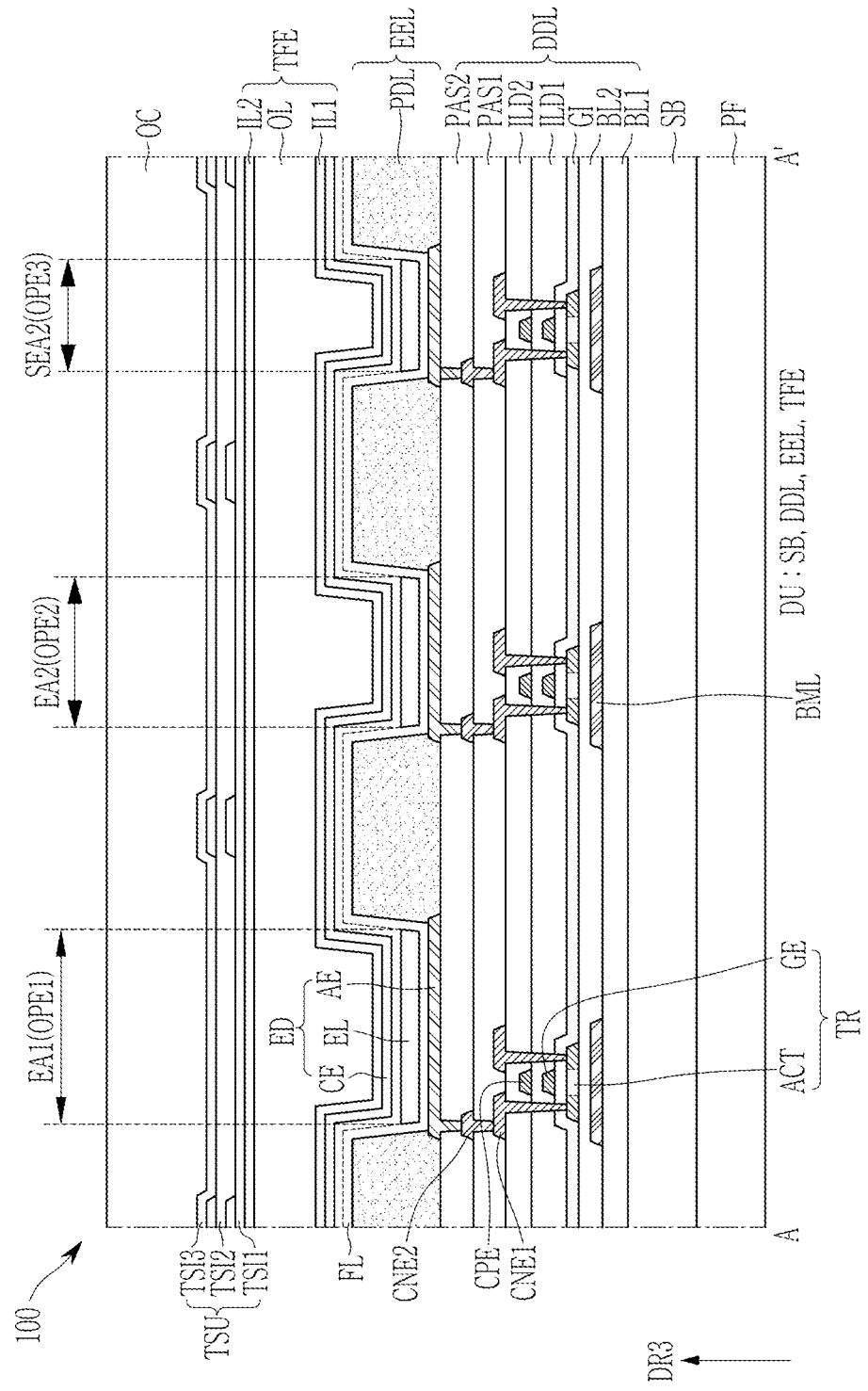
FIG. 14 is a schematic cross-sectional view of a display device according to an embodiment.

FIG. 14 is a schematic cross-sectional view of a display device according to an embodiment.

Referring to FIG. 14, the cross-sectional structure of the display device 30 will be described in more detail. The display panel 100 of the display device 30 may include a display part DU, a touch sensing part TSU, a protective film PF, and the like. The reflection reduction layer ARL on the touch sensing part TSU and the protective sheet PS under the protective film PF, which have been described with reference to FIG. 5, are not illustrated.

The display part DU may include a substrate SB, a driving element layer DDL, a light emitting element layer EEL, and/or an encapsulation layer TFE.

The substrate SB may be a flexible or rigid substrate. The substrate SB may include one or more polymer layers and at least one barrier layer. The barrier layer may include an inorganic insulating material such as silicon nitride ($SiN_x$), silicon oxide ($SiO_x$), or silicon oxynitride ($SiO_xN_y$), and may prevent penetration of moisture, oxygen, and the like.

The driving element layer DDL includes a first buffer layer BL1, a lower metal layer BML, a second buffer layer BL2, a transistor TR, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, a second passivation layer PAS2, and/or the like.

The first buffer layer BL1 may be positioned on the substrate SB, the lower metal layer BML may be positioned on the first buffer layer BL1, and the second buffer layer BL2 may cover or overlap the lower metal layer BML.

The transistor TR may be positioned on the second buffer layer BL2. The transistor TR may be a driving transistor or a switching transistor of the pixel circuit part. The transistor TR may include a semiconductor layer ACT and a gate electrode GE.

The semiconductor layer ACT may be positioned on the second buffer layer BL2. The semiconductor layer ACT may overlap the lower metal layer BML. The semiconductor layer ACT may include a first region, a second region, and a channel region between these regions. The semiconductor layer ACT may include a semiconductor material such as an oxide semiconductor, amorphous silicon, or polycrystalline silicon. For example, the semiconductor layer ACT may include low-temperature polycrystalline silicon (LTPS) or an oxide semiconductor material including at least one of zinc (Zn), indium (In), gallium (Ga), and tin (Sn). For example, the semiconductor layer ACT may include indium-gallium-zinc oxide (IGZO).

The first region and the second region may be regions in which the semiconductor material is conductive in the semiconductor layer ACT.

The gate electrode GE may be positioned on the gate insulating layer GI and may overlap the channel region of the semiconductor layer ACT. The gate insulating layer GI may cover the semiconductor layer ACT and insulate the semiconductor layer ACT from the gate electrode GE.

The first interlayer insulating layer ILD1 may cover the gate electrode GE. The capacitor electrode CPE may be positioned on the first interlayer insulating layer ILD1. The capacitor electrode CPE may overlap the gate electrode GE. The capacitor electrode CPE and the gate electrode GE may constitute a capacitor. The second interlayer insulating layer ILD2 may cover the capacitor electrode CPE.

The bottom metal layer BML, the gate electrode GE, and the capacitor electrode CPE may include, e.g., molybdenum (Mo), aluminum (Al), copper (Cu), titanium (Ti), and the like, and can be a single layer or multiple layers. Each of the first buffer layer BL1, the second buffer layer BL2, the gate insulating layer GI, the first interlayer insulating layer ILD1, and the second interlayer insulating layer ILD2 may include an inorganic insulating material such as silicon nitride, silicon oxide, silicon oxynitride, or the like, and it may be a single layer or multiple layers.

The first connection electrode CNE1 may be positioned on the second interlayer insulating layer ILD2 and may be connected to the first region of the semiconductor layer ACT through a contact hole formed in the gate insulating layer GI, the first interlayer insulating layer ILD1, and the second interlayer insulating layer ILD2. The first passivation layer PAS1 may cover or overlap the first connection electrode CNE1.

The second connection electrode CNE2 may be positioned on the first passivation layer PAS1, and may be connected to the first connection electrode CNE1 through a contact hole formed in the first passivation layer PAS1. The second passivation layer PAS2 may cover the second connection electrode CNE2.

Each of the first connection electrode CNE1 and the second connection electrode CNE2 may include, e.g., aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), etc., and may be a single layer or multiple layers. Each of the first passivation layer PAS1 and the second passivation layer PAS2 may include an organic insulating material such as a general-purpose polymer such as poly(methyl methacrylate) and polystyrene, a polymer derivative having a phenolic group, an acrylic polymer, an imide-based polymer (e.g., polyimide), a siloxane-based polymer, etc.

The light emitting element layer EEL may be positioned on the driving element layer DDL. The light emitting element layer EEL may include a light emitting element ED and a pixel definition layer PDL. The light emitting element ED may include a pixel electrode AE, an emission layer EL, and a common electrode CE. The light emitting element ED may further include a functional layer FL including at least one of a hole injection layer, a hole transport layer, an electron injection layer, and an electron transport layer. The functional layer FL may include a portion positioned between the pixel electrode AE and the emission layer EL and a portion positioned between the emission layer EL and the common electrode CE.

The pixel electrode AE may be positioned on the second passivation layer PAS2 and connected to the second connection electrode CNE2 through a contact hole formed in the second passivation layer PAS2. Accordingly, the pixel electrode AE may be electrically connected to the first region of the semiconductor layer ACT of the transistor TR, and may receive a driving current through the transistor TR. The pixel electrode AE may be formed of a reflective conductive material or a semi-transmissive conductive material, or may also be formed of a transparent conductive material. For example, the pixel electrode AE may include a transparent conductive material such as indium tin oxide (ITO) or indium zinc oxide (IZO). The pixel electrode AE may include, e.g., a metal or metal alloy such as lithium (Li), calcium (Ca), aluminum (Al), silver (Ag), magnesium (Mg), or gold (Au). The pixel electrode AE may have a multilayer structure, for example, a triple layer structure such as ITO/silver (Ag)/ITO.

The emission layer EL may be positioned on the pixel electrode AE. For example, the emission layer EL may be an organic emission layer made of an organic material. The portion of the functional layer FL positioned between the emission layer EL and the pixel electrode AE may include a hole injection layer and/or a hole transport layer, and the portion of the functional layer FL positioned between the emission layer EL and the common electrode CE may include an electron transport layer and/or an electron injection layer.

The common electrode CE may be positioned on the emission layer EL. The common electrode CE may constitute a light emitting element ED such as an organic light emitting diode or an inorganic light emitting diode together with the pixel electrode AE and the emission layer EL. The pixel electrode AE may be an anode of the light emitting element ED, and the common electrode CE may be a cathode of the light emitting element ED. The common electrode CE may have light transmittance by having a thin layer of a metal or a metal alloy with a low work function such as calcium (Ca), barium (Ba), magnesium (Mg), aluminum (Al), or silver (Ag). The common electrode CE may include a transparent conductive oxide such as indium tin oxide (ITO) or indium zinc oxide (IZO). A low-potential power supply voltage (or common voltage) may be applied to the common electrode CE.

The pixel definition layer PDL may be positioned on the second passivation layer PAS2 and may cover an edge of the pixel electrode AE. The pixel definition layer PDL may include openings OPE1, OPE2, and OPE3 overlapping the pixel electrode AE. The openings OPE1, OPE2, and OPE3 of the pixel definition layer PDL may define light emitting regions EA1, EA2, and EA3, and their areas or sizes may be different from each other. The light emitting regions EA1, EA2, and EA3 may include a first light emitting region EA1, a second light emitting region EA2, and a third light emitting region EA3 emitting different colors. For example, the first light emitting region EA1 can emit red light, the second light emitting region EA2 can emit green light, and the third light emitting region EA3 can emit blue light. The pixel definition layer PDL may be a black pixel definition layer including a color pigment such as a black pigment or a blue pigment. For example, the pixel definition layer PDL may include a polyimide binder and a mixture of red, green, and blue pigments. For example, the pixel definition layer PDL may include a cardo binder resin and a mixture of black and blue pigments. The pixel definition layer PDL may include carbon black. The black pixel definition layer can improve the contrast ratio and prevent reflection by the underlying metal layer.

The encapsulation layer TFE may be positioned on the common electrode CE to cover the light emitting elements ED. The encapsulation layer TFE may encapsulate the light emitting element layer EEL to prevent penetration of moisture or oxygen from the outside. The encapsulation layer TFE may be a thin film encapsulation layer including one or more inorganic layers and at least one organic layer. For example, the encapsulation layer TFE may have a triple layer structure of a first inorganic layer IL1, an organic layer OL, and a second inorganic layer IL2. The first inorganic layer IL1 may cover the common electrode CE and prevent penetration of moisture or oxygen into the light emitting elements ED. The organic layer OL may cover surface curvature of the first inorganic layer IL1 or particles present on the first inorganic layer IL1. The organic layer OL may block the influence of the surface state of the first inorganic layer IL1 on the components formed on the organic layer OL. The organic layer OL may relieve stress between the contacting layers. The second inorganic layer IL2 may cover the organic layer OL. The second inorganic layer IL2 may prevent moisture or the like from being released from the organic layer OL. The first inorganic layer IL1 and the second inorganic layer IL2 may include an inorganic material such as silicon oxide, silicon nitride, silicon oxynitride, aluminum oxide, titanium oxide, tantalum oxide, hafnium oxide, or zinc oxide. The organic layer OL may include an organic material such as acrylic resin, epoxy resin, polyimide, or polyethylene.

The touch sensing part TSU may include sensing electrodes TSE1 and TSE2 and insulating layers TSI1, TSI2, and TSI3 positioned on at least one side of the sensing electrodes TSE1 and TSE2. The sensing electrodes TSE1 and TSE2 may be insulated with the insulating layer TSI2 interposed therebetween, and portions thereof may be electrically connected through a contact hole formed in the insulating layer TSI2. The sensing electrodes TSE1 and TSE2 may be electrically connected to the touch driver 400 of the display device 30 shown in FIG. 2. The touch driver 400 may supply a touch driving signal to the sensing electrodes TSE1 and TSE2 and detect a change in capacitance between the sensing electrodes TSE1 and TSE2. The sensing electrodes TSE1 and TSE2 may include, e.g., aluminum (Al), copper (Cu), silver (Ag), gold (Au), molybdenum (Mo), titanium (Ti), tantalum (Ta), and the like, and may be a single layer or multiple layers. The insulating layers TSI1, TSI2, and TSI3 may include an inorganic insulating material and/or an organic insulating material.

An overcoat layer OC may be positioned on the touch sensing part TSU. The overcoat layer OC may planarize the upper surface of the display panel 100. The overcoat layer OC may include a colorless light-transmissive organic material such as an acrylic resin.

Figure 15:
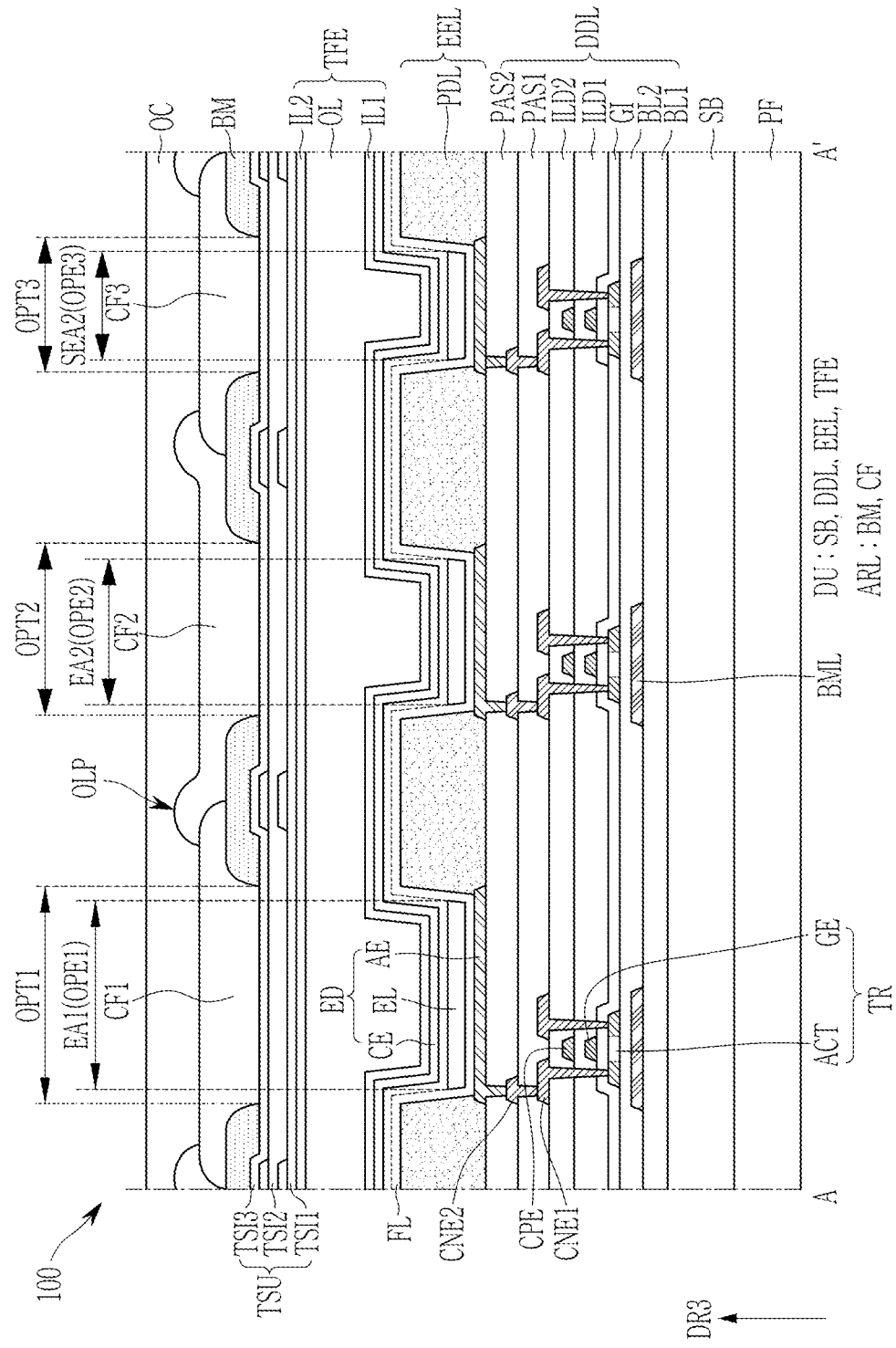
FIG. 15 is a schematic cross-sectional view of a display device according to an embodiment.

FIG. 15 is a schematic cross-sectional view of a display device according to an embodiment.

FIG. 15 illustrates a structure in which a reflection reduction layer ARL is positioned on the touch sensing part TSU, compared to the embodiment of FIG. 14. The reflection reduction layer ARL may include a light blocking member BM and color filters CF (e.g., CF1, CF2, and CF3). The reflection reduction layer ARL may be covered by an overcoat layer OC.

The light blocking member BM may be positioned on the touch sensing part TSU. The light blocking member BM may include openings OPT1, OPT2, and OPT3 overlapping the emission regions EA1, EA2, and EA3. The area or size of each of the openings OPT1, OPT2, and OPT3 may be greater than that of corresponding openings OPE1, OPE2, and OPE3 of the pixel definition layer PDL. As the openings OPT1, OPT2, and OPT3 of the light blocking member BM are formed larger than the openings OPE1, OPE2, and OPE3 of the pixel definition layer PDL, light may be emitted from the light emitting regions EA1, EA2, and EA3, and the light may be emitted not only in the front direction of the display device 30 but also in the side direction. The light blocking member BM may include a light absorbing material. For example, the light blocking member BM may include an inorganic black pigment or an organic black pigment. The inorganic black pigment may be carbon black, and the organic black pigment may include lactam black, perylene black, and/or aniline black. The light blocking member BM may improve color reproducibility of the display device 30 by preventing color mixing due to visible light penetrating between the first to third light emitting regions EA1, EA2, and EA3.

The color filters CF1, CF2, and CF3 may be positioned on the light blocking member BM. The color filters CF1, CF2, and CF3 may be disposed to correspond to the light emitting regions EA1, EA2, and EA3. For example, the first color filter CF1 may overlap the first opening OPE1 of the pixel definition layer PDL and the first opening OPT1 of the light blocking member BM, the second color filter CF2 may overlap the second opening OPE2 of the pixel definition layer PDL and the second opening OPT2 of the light blocking member BM, and the third color filter CF3 may overlap the third opening OPE3 of the pixel definition layer PDL and the third opening OPT3 of the light blocking member BM. Each of the color filters CF1, CF2, and CF3 may be disposed to have a larger area in a plan view than the corresponding openings OPT1, OPT2, and OPT3 of the light blocking member BM, and a portion of each color filter CF1, CF2, and CF3 may overlap the light blocking member BM. An overlapping portion OLP where adjacent color filters CF1, CF2, and CF3 overlap each other may be positioned on the light blocking member BM. The color filters CF1, CF2, and CF3 may include a colorant such as a dye or pigment that absorbs light in a wavelength range other than a specific wavelength range, and emits light from the light emitting regions EA1, EA2, and EA3, and it can be disposed corresponding to the color of the light. For example, the first color filter CF1 may be a red color filter that transmits only red light, the second color filter CF2 may be a green color filter that transmits only green light, and the third color filter CF3 may be a blue color filter that transmits only blue light. In the reflection reduction layer ARL, the color filters CF1, CF2, and CF3 may transmit light of a specific wavelength and block or absorb light of other wavelengths, and the light blocking member BM may absorb external light. Accordingly, the amount of light introduced from the outside into the display device 30 may be reduced, and the amount of light reflected by the display device 30 may also be reduced, thereby reducing drawbacks caused by reflection of external light. The overcoat layer OC may cover the color filters CF1, CF2, and CF3 and planarize the upper surface of the display panel 100. As the reflection reduction layer ARL, a polarization layer may be included instead of a combination of the color filters CF1, CF2, and CF3 and the light blocking member BM.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device, comprising:
a display panel including a pad area; and
a flexible printed circuit board connected to the display panel, wherein
the flexible printed circuit board comprises:
a body where components are located;
a pressing portion disposed along an edge of the body and attached to the pad area; and
a bypass portion having an end and another end connected to the body and including wires.

2. The display device of claim 1, wherein the bypass portion is bent so that at least a portion of the bypass portion overlaps the body.

3. The display device of claim 2, further comprising:
a shielding layer disposed between the bypass portion and the body in a bent state of the bypass portion.

4. The display device of claim 2, further comprising:
a display driver disposed on the display panel; and
a cover covering at least a portion of the display driver and the flexible printed circuit board,
wherein the bypass portion is disposed between the body and the cover in a bent state of the bypass portion.

5. The display device of claim 2, further comprising:
a double-sided tape that attaches the flexible printed circuit board to a rear surface of the display panel; and
the bypass portion is disposed between the body and the double-sided tape in a bent state of the bypass portion.

6. The display device of claim 1, wherein the bypass portion includes:
a first leg portion and a second leg portion extending from the body; and
a connection portion connected between the first leg portion and the second leg portion.

7. The display device of claim 6, wherein the connection portion and the pressing portion extend in a same direction.

8. The display device of claim 6, wherein
the first leg portion and the second leg portion are bent, and
the connection portion is attached to the body.

9. The display device of claim 1, wherein
the flexible printed circuit board includes conductive layers which are sequentially stacked, and
a number of the conductive layers included in the bypass portion is smaller than a number of the conductive layers included in the body.

10. The display device of claim 9, wherein the number of the conductive layers included in the bypass portion is equal to a number of the conductive layers included in the pressing portion.

11. The display device of claim 9, wherein
the body includes three or more conductive layers, and
the bypass portion includes two or less conductive layers.

12. The display device of claim 9, wherein
the bypass portion includes:
a support film;
a first conductive layer disposed on a first side of the support film; and
a second conductive layer disposed on a second side of the support film,
the first conductive layer includes a wire transmitting a touch signal, and
the second conductive layer includes a ground layer.

13. The display device of claim 12, wherein
the bypass portion is bent so that at least a portion of the bypass portion overlaps the body, and
the second conductive layer is disposed farther from the body than the first conductive layer in a bent state of the bypass portion.

14. The display device of claim 1, wherein the portions include a touch driver.

15. The display device of claim 14, wherein the wire disposed in the bypass portion electrically connects the touch driver and the pad of the pressing portion.

16. A display device, comprising:

a display panel including a main area including a display area and a touch area, and a sub-area extending from the main area and in which a display driver is located; and a flexible printed circuit board connected to the sub-area, wherein the flexible printed circuit board comprises:
- a body in which the touch driver is located;
- a pressing portion disposed along an edge of the body and attached to the sub-area;
- a tail extending from the body and having a connector disposed at an end; and a bypass portion including:
  - a first leg portion and a second leg portion extending in a same direction from the body; and
  - a connection portion connected between the first leg portion and the second leg portion.

17. The display device of claim 16, wherein the first leg portion and the second leg portion are bent, and the connection portion overlaps the body.

18. The display device of claim 17, wherein the display device further includes a shielding layer overlapping the connection portion and the body, and disposed between the connection portion and the body.

19. The display device of claim 16, wherein the flexible printed circuit board includes conductive layers which are sequentially stacked, and a number of the conductive layers included in the bypass portion is smaller than a number of the conductive layers included in the body and equal to a number of the conductive layers included in the pressing portion.

20. The display device of claim 19, wherein the body includes a first conductive layer, a second conductive layer, a third conductive layer, and a fourth conductive layer arranged in a thickness direction, and the bypass portion, the first conductive layer, and the second conductive layer include a same conductive layer, or the bypass portion, the third conductive layer, and the fourth conductive layer include a same conductive layer.

* * * * *